United States Patent
Pires

(10) Patent No.: US 6,703,567 B2
(45) Date of Patent: Mar. 9, 2004

(54) CONDUCTOR TRACK LAYER STRUCTURE AND PRESTAGE THEREOF

(75) Inventor: Francisco Jose Fernandes Pires, Porto (PT)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 09/816,932

(22) Filed: Mar. 23, 2001

(65) Prior Publication Data

US 2001/0026442 A1 Oct. 4, 2001

(30) Foreign Application Priority Data

Mar. 23, 2000 (DE) .......................... 100 14 382

(51) Int. Cl.[7] .......................... H01R 12/04; H05K 1/11
(52) U.S. Cl. ...................................... 174/261; 174/254
(58) Field of Search .................. 74/261, 257; 361/723, 361/773, 774, 776; 174/254

(56) References Cited

U.S. PATENT DOCUMENTS

| | | | | |
|---|---|---|---|---|
| 3,061,911 A | * | 11/1962 | Baker | 29/847 |
| 4,580,193 A | * | 4/1986 | Edwards | 361/407 |
| 5,243,496 A | * | 9/1993 | Mermet-Guyennet | 361/748 |
| 5,365,406 A | * | 11/1994 | Kurashima | 361/777 |
| 5,541,814 A | * | 7/1996 | Janai et al. | 361/778 |
| 5,956,237 A | | 9/1999 | Kohmura et al. | |

* cited by examiner

*Primary Examiner*—John B. Vigushin
*Assistant Examiner*—Jeremy Norris
(74) *Attorney, Agent, or Firm*—Laurence A. Greenberg; Werner H. Stemer; Gregory L. Mayback

(57) ABSTRACT

The invention relates to a conductor track layer structure precursor stage with conductor tracks, which are disposed on an electrically insulating substrate with an inner region and a lateral peripheral region and which are connected via conductor track current lines to at least one current line which extends in the lateral peripheral region. Per conductor track, there is one conductor track current line. The conductor tracks are electrically insulated from one another within the inner region of the conductor track layer structure precursor stage. The invention also relates to a conductor track layer structure which can be obtained from the conductor track layer structure precursor stage.

4 Claims, 3 Drawing Sheets

CONDUCTOR TRACK LAYER STRUCTURE AND PRESTAGE THEREOF

BACKGROUND OF THE INVENTION

1. Field of the Invention

The invention relates to a conductor track layer structure and to a precursor stage for it.

2. Description of the Related Art

For connecting electronic components such as semiconductor chips, capacitors and so forth or additional connection planes, conductor track layer structures are often used, which have a plurality of conductor tracks that are disposed on an electrically insulating substrate. As the substrate, flexible films or rigid substrates can be used. Furthermore, in addition to the conductor tracks, the conductor track layer structures can optionally have additional connection planes. Over the course of production, the conductor tracks are typically provided with an electroplated coating. For this electrochemical coating, the conductor tracks of a conductor track layer structure precursor stage are connected to a current source and are dipped into an electroplating solution. After the electroplating is completed, the conductor track current lines that have connected the conductor tracks to the current source have to be severed, so that the conductor tracks on the conductor track layer structure can be electrically insulated from one another for later use. FIG. 5a shows a typical arrangement of conductor tracks and conductor track current lines in a conventional conductor track layer structure precursor stage. The conductor track layer structure precursor stage 1 has an electrically insulating substrate 3, in whose inner region 4 (between the dashed lines) conductor tracks 2 are embodied. For the electroplating, the conductor tracks 2 are connected via conductor track current lines 7 to current lines 6, which are located in opposed lateral peripheral regions 5 of the conductor track layer structure precursor stage 1. During the electroplating, the current lines 6 are connected to a current source, not shown. Reference numeral 8 indicates connection pads for solder beads, which can be used for connecting the conductor tracks to a different connection plane or to an electronic component.

In the prior art, it is usual to connect a plurality of a conductor tracks to one lateral current line 6 by way of one conductor track current line 7. This kind of common connection of conductor tracks 2 is shown for the two lower conductor tracks in FIG. 5a. The conductor track current line 7, which is connected to the current line 6 on the right, first connects the two lower conductor tracks 2 to one another and then is extended laterally outward to the current line 6. After the electroplating has been completed, the lateral peripheral regions 5 of the conductor track layer structure precursor stage 1 are removed by being knocked off. The electrical connection of the two lower conductor tracks is preserved, however. For the further use of the conductor track layer structure, this electrical connection between the conductor tracks must be interrupted. This is done mechanically, in that one of the conductor tracks 2 is severed in the region of the rated breaking point 9.

FIG. 5b shows the arrangement of FIG. 5a in cross section along one of the two lower conductor tracks. The conductor track layer structure is secured to an electronic component 10. In the region of the binding window 11, in which the conductor track is in the open, the conductor track layer structure 1 is electrically conductively connected to a bonding pad 12 of a conduction plane 13 of the electronic component 10. The rated breaking point 9 is also located in the region of the window 11. This figure shows the state in which the rated breaking point 9 has already been destroyed. The prerequisite for severing the conductor track in the region of the rated breaking point 9 is that the rated breaking point have an adequate spacing from the plane beneath it, and that the region to be severed of the conductor track have an adequate length so that the tension required for the severing can be generated. In other words, severing the conductor track would not be possible without a minimum spacing of the conductor track from the plane beneath it in the region of the rated breaking point 9 and without a minimum length of the conductor track in that region. As a consequence, conventional conductor track layer structures have a greater thickness than would be desirable, and the region around the rated breaking point occupies a relatively large amount of space on the conductor track layer structure. Another disadvantage is that when the conductor tracks in the region of the rated breaking point are severed, high tension is exerted on the conductor track and the surrounding region of the conductor track layer structure. This can lead to damage of the conductor track layer structure, and especially of the conductor track itself.

SUMMARY OF THE INVENTION

The object of the invention is accordingly to disclose a conductor track layer structure precursor stage and a conductor track layer structure that do not have the disadvantages described.

This object is attained with a conductor track layer structure precursor stage comprising:

- an electrically insulating substrate having an inner region and two opposite lateral peripheral regions;
- two current lines, each extending respectively in one of the two opposite lateral peripheral regions;
- a plurality of conductor tracks disposed on the inner region of the electrically insulating substrate;
- a plurality of conductor track current lines connecting the plurality of conductor tracks, respectively, to one of the two current lines;
- said conductor tracks being connected to one of the two current lines via a separate conductor track current line and being electrically insulated from the other of the two current lines; and
- the conductor tracks inside the inner region being electrically insulated from one another.

According to another feature of the invention, the electrically insulating substrate is a flexible plastic film.

This object is further attained with a conductor track layer structure, comprising the conductor track layer structure precursor stage in which the lateral peripheral regions are removed.

According to an additional feature of the invention, the lateral peripheral regions are knocked off.

In the conductor track layer structure precursor stage of the invention, the conductor tracks, which are disposed in the usual way on an electrically insulating substrate, are connected in such a way to at least one current line, which is located in a lateral peripheral region of the conductor track layer structure precursor stage, that each of the conductor tracks is connected, by a separate conductor track current line, to the at least one laterally extending current line. Unlike the prior art, the conductor tracks within the inner region of the conductor track layer structure precursor stage are electrically insulated from one another.

This arrangement has the advantage that in the inner region of the conductor track layer structure precursor stage, after an electroplating operation, no electrical connections among the various conductor tracks have to be interrupted. On the contrary, it is sufficient if the lateral peripheral regions, in which the current lines that serve the purpose of connection to a current source during the electroplating operation are disposed are removed after the electroplating. The removal of the lateral peripheral regions can be done in the usual way for the prior art, such as by knocking it off. No further provisions are needed for electrically insulating the conductor tracks, which remain on the conductor track layer structure after the lateral peripheral regions have been removed. Thus in the inner region of the conductor track layer structure precursor stage, in the region of the conductor tracks, rated breaking points, as were usual in the prior art, need not be provided, and there is no need to pierce the rated breaking points after the electroplating. Since rated breaking points are not necessary in the conductor track layer structure precursor stage of the invention, the spacing between the conductor tracks and an adjacent connection plane can be less than was possible in the conductor track layer structure precursor stages of the prior art. The loss in terms of surface as well, which was dictated by the relatively large demand for space for the conductor track in the region of the binding window having the rated breaking point, can be averted as well. Consequent damage of the kind that occurred when the conductor tracks in the region of the rated breaking point were severed in the conventional conductor track layer structure precursor stages, do not occur in the conductor track layer structure precursor stages of the invention.

The embodiment of the conductor track layer structure precursor stage of the invention and of the conductor track layer structure that can be obtained from it can fundamentally be done in the usual way for the prior art—aside from the disposition of the conductor track current lines. The materials used for the electrically insulating substrate and the conductor tracks and the other components of the conductor track layer structure or conductor track layer structure precursor stage, the disposition of the various components, and so forth can correspond to what is usual in the prior art. Preferably, a flexible plastic film is used as the electrically insulating substrate. However, the invention is also fundamentally suitable for printed circuit boards that have a rigid substrate.

The current supply line for connection to a current source can extend in only one of the lateral peripheral regions of the conductor track layer structure precursor stage. Alternatively, it is possible to dispose a plurality of current supply lines in a plurality of lateral peripheral regions of the conductor track layer structure precursor stage. Expediently, two current supply lines are provided in opposed peripheral regions of the conductor track layer structure precursor stage. In that case, the conductor tracks are connected to either one or the other of the current supply lines, with the choice of current supply line being determined for instance by the available space for the conductor track current lines that extend from the conductor tracks to the current supply lines. The conductor track is electrically insulated from the respective other current supply line, to which the conductor track is not connected via a conductor track current line.

The invention will be described in further detail below in conjunction with drawings. Shown schematically in them are

DESCRIPTION OF THE PREFERRED EMBODIMENT

Figure 1:
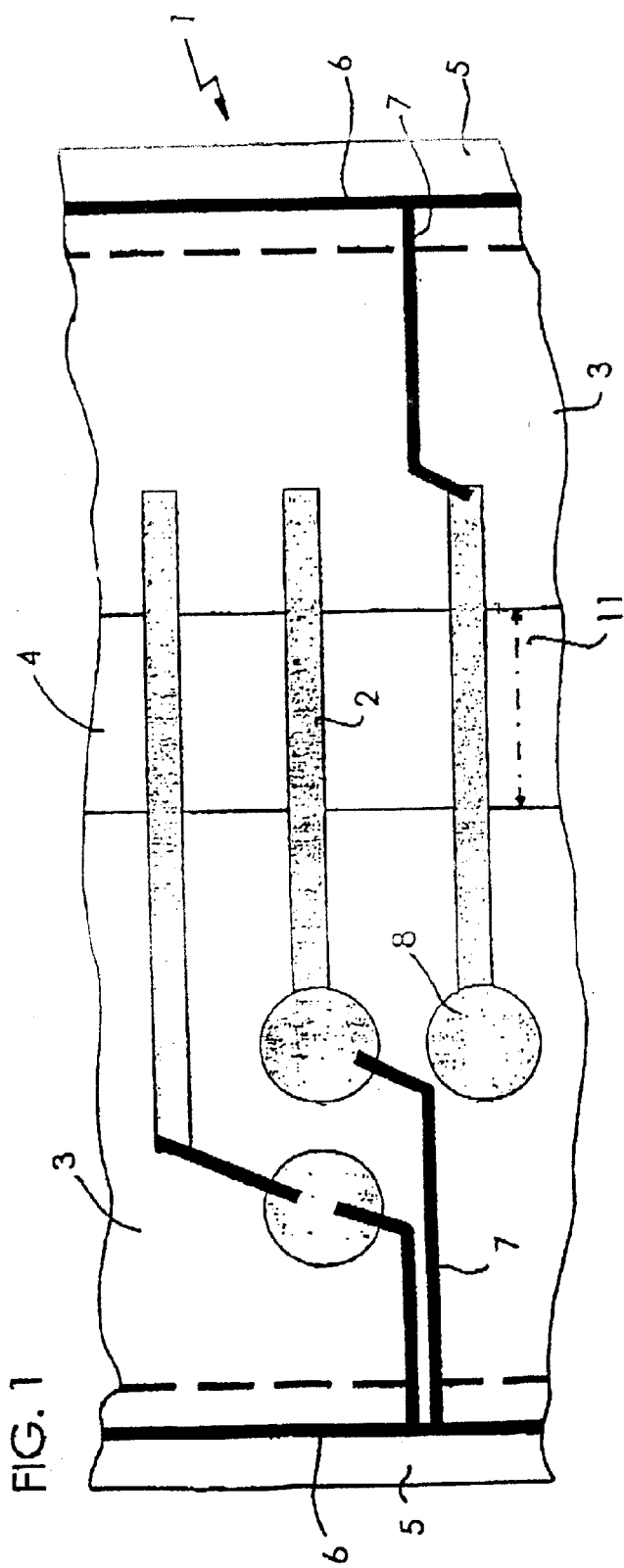
FIG. 1, a fragmentary plan view on a conductor track layer structure precursor stage of the invention.

In FIG. 1, the arrangement of conductor tracks 2 in a conductor track layer structure precursor stage 1 of the invention is shown schematically. Identical components are identified by the same reference numerals as in FIG. 5. The conductor tracks 2 extend in the inner region 4 on an electrically insulating substrate 3. Each of the individual conductor tracks 2 is connected to a conductor track current line 7, which extend laterally to the outside from the inner region 4 of the electrically insulating substrate. In opposed lateral peripheral regions 5 of the electrically insulating substrate 3, the conductor track current lines 7 are connected to one of the two current lines 6 that extend in the lateral peripheral regions 5. The current lines 6 are connected to a current source, which is not shown in the drawing.

Figure 2:
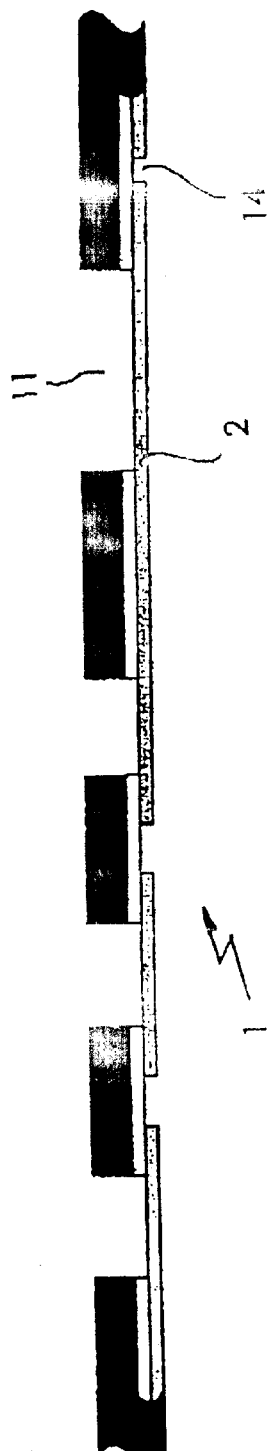
FIG. 2, a cross section through a conductor track layer structure precursor stage of the invention.

Unlike the prior art, the individual conductor tracks 2 of the conductor track layer structure precursor stage 1 of the invention are electrically insulated from one another in the inner region 4 of the electrically insulating substrate 3. Each individual one of the conductor tracks 2 has its own conductor track current line 7, which is extended laterally to one of the current lines 6. The conductor tracks 2 are electrically insulated from the respective other one of the current lines 6. This can be seen in FIG. 2, in which a cross section along one of the conductor tracks is shown. In the right-hand peripheral region in this figure, the conductor track 2 is interrupted by an opening 14.

Figure 3:
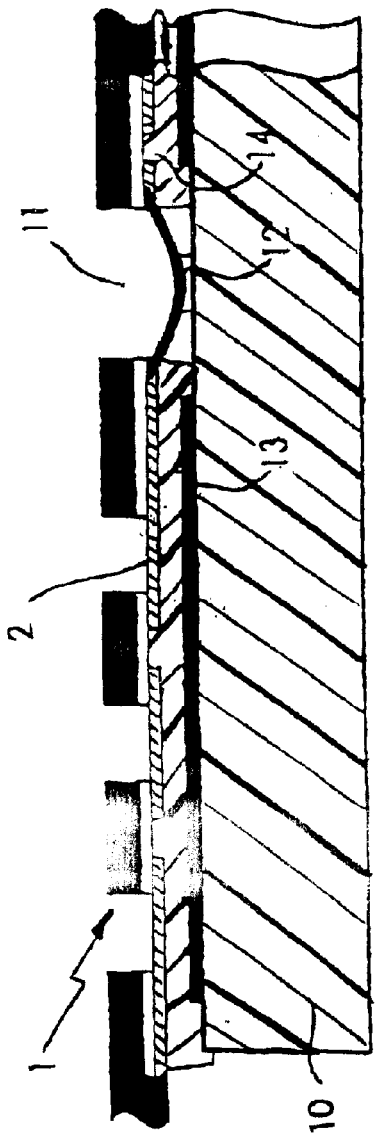
FIG. 3, a cross section through a conductor track layer structure precursor stage of the invention, after it is secured to an electronic component.
Figures 5A, 5B:
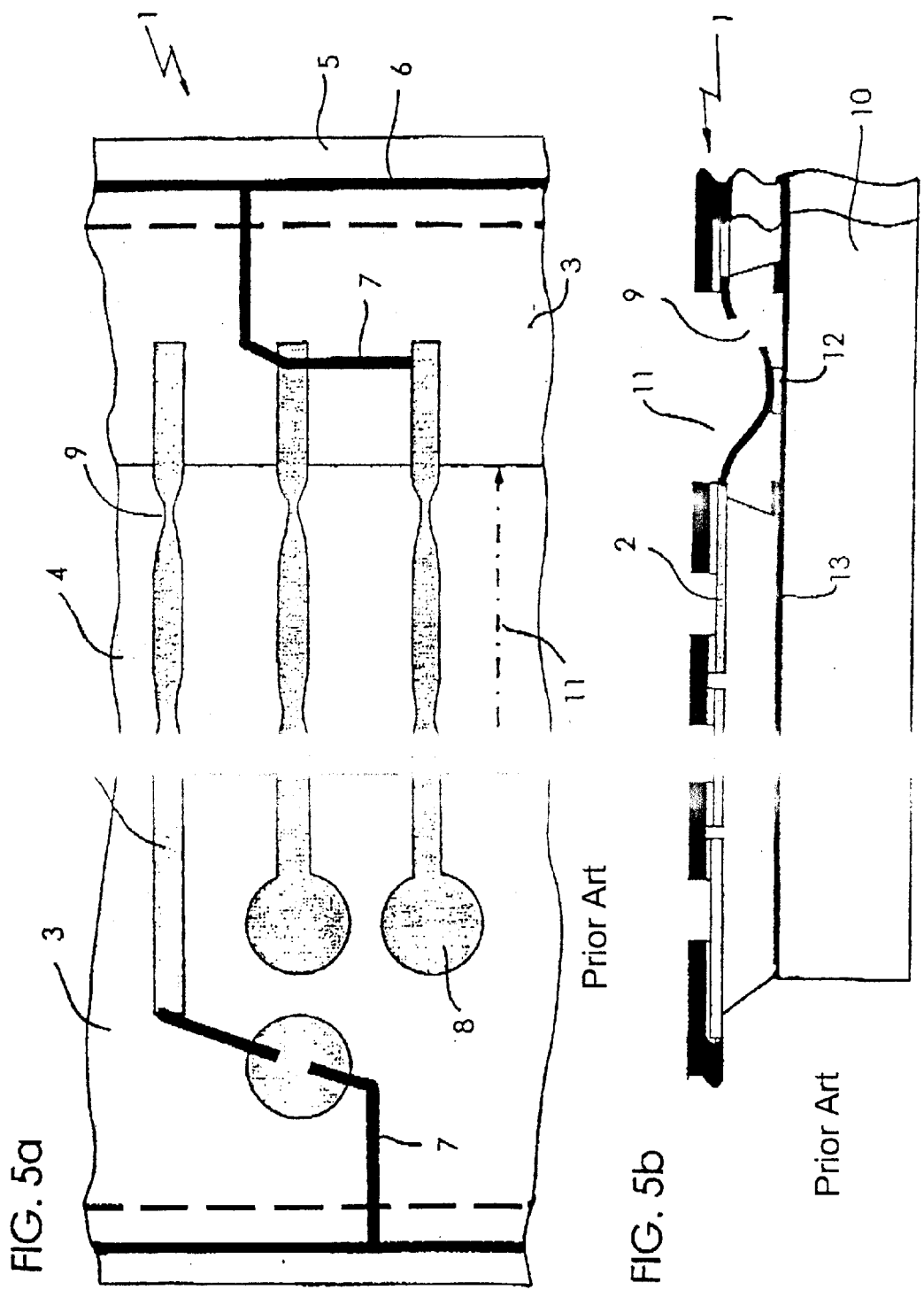
FIG. 5a, a conductor track layer structure precursor stage of the prior art in fragmentary plan view.
FIG. 5b, a conductor track layer structure precursor stage of the prior art in cross section, secured to an electronic component.

FIG. 3 shows a cross section through a conductor track layer structure precursor stage 1 of the invention, once this stage has been secured to an electronic component 10 and the conductor track 2 has been contacted with the bonding pad 12 of the conduction plane 13. From this figure it can be seen that the binding window 11—compared with the arrangement of the prior art, as shown in FIG. 5b —can be markedly smaller. The spacing between the conductor track 2 and the bonding pad 12 located beneath it can also be considerably less than in the prior art. This becomes possible because in the arrangement of the invention, the conductor track 2 in the region of the window 11 need not be severed. The minimum length of the conductor track and the minimum spacing from the bonding pad located beneath it, as it was required in the prior art to enable severing the conductor track in this region, are not needed in the arrangement of the invention. Furthermore, the conductor track is not subjected to the stress that was exerted on it upon severing in accor dance with the prior art. Damage to the conductor track and the surroundings can therefore be avoided in the arrangement of the invention.

Figure 4:
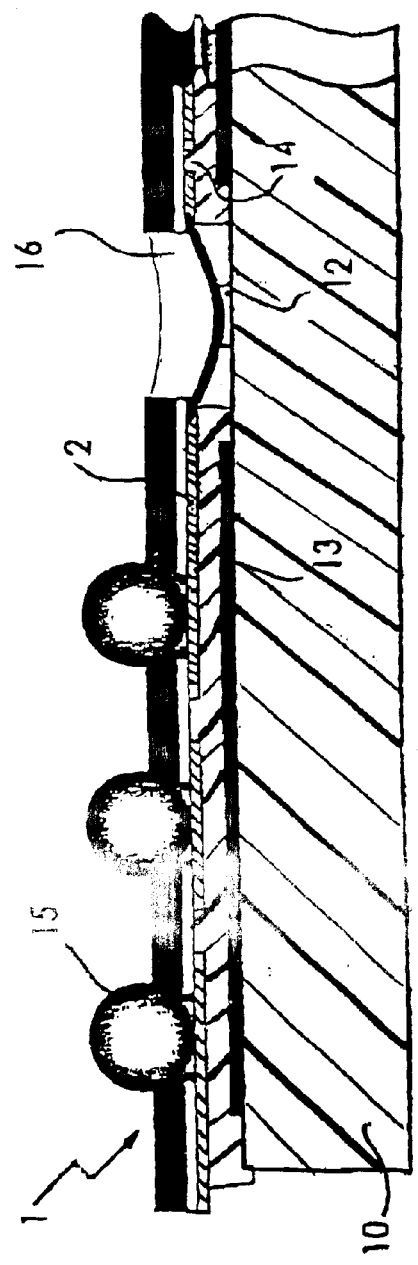
FIG. 4, a cross section through a conductor track layer structure of the invention, which is secured to an electronic component.

FIG. 4 shows the arrangement of a conductor track layer structure of the invention, which is obtained by cutting off the peripheral regions 5 along the dashed lines from the conductor track layer structure precursor stage of FIG. 1. In addition, for contacting a further connection plane, solder beads 15 are placed on the connection pads 8. The binding window 11 is sealed with a covering composition 16. The cutting off of the peripheral regions 5 is expediently done in the usual way for the prior art, for instance by being knocked off. Because the conductor track layer structure precursor stage 1 is embodied according to the invention, the bindings of the various conductor tracks 2 to the lateral current lines 6 can be interrupted in a single work step. No additional steps are needed for electrically insulating the individual conductor tracks 2.

List of Reference Numerals
1 Conductor tract layer structure precursor stage
2 Conductor tract
3 Substrate
4 Inner region
5 Peripheral region
6 Current line
7 Conductor tract current line
8 Connection pad
9 Rated breaking point
10 Electronic component
11 Binding window
12 Bonding pad
13 Conduction plane
14 Opening
15 Solder bead
16 Covering composition

What is claimed:

1. A conductor track layer structure precursor stage comprising:
    an electrically insulating substrate having an inner region and two opposite lateral peripheral region, said inner region having a binding window;
    two current lines, each extending respectively in one of said two opposite lateral peripheral regions;
    bonding pads disposed in a region of said binding window;
    a plurality of conductor tracks disposed on said inner region of said electrically insulating substance, said conductor tracks not having rated breaking points, not being severed in the region of said breaking window, and contacting said bonding pads;
    a plurality of conductor tract current lines connecting said plurality of conductor tracts, respectively, to one of said two current lines;
        each of said conductor tracts being connected to a respective one of said two current lines via a separate conductor track current line and being electrically insulated from the other of said two current lines; and
        said conductor tracks inside said inner region being electrically insulated from one another.

2. The conductor track layer structure precursor stage according to claim 1, wherein said electrically insulating substrate is a flexible plastic film.

3. A conductor track layer structure, comprising the conductor track layer structure precursor stage according to claim 1 or 2 in which the lateral peripheral regions are removed.

4. The conductor track layer structure according to claim 3, wherein the lateral peripheral regions are knocked off.

* * * * *